United States Patent
Lefever et al.

(12) 
(10) Patent No.: US 6,252,415 B1
(45) Date of Patent: Jun. 26, 2001

(54) PIN BLOCK STRUCTURE FOR MOUNTING CONTACT PINS

(75) Inventors: Douglas D. Lefever, Evanston; Donald W. Harer, Wonder Lake, both of IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/395,599

(22) Filed: Sep. 14, 1999

(51) Int. Cl.[7] ................................................. G01R 31/02
(52) U.S. Cl. ........................... 324/761; 324/754; 324/758
(58) Field of Search ................................. 324/754, 72.5, 324/758, 765, 761, 755; 439/75, 78

(56) References Cited

U.S. PATENT DOCUMENTS 5,635,847 * 6/1997 Seidel ................................... 324/754
5,982,187 * 11/1999 Tarzwell ............................... 324/756

* cited by examiner

Primary Examiner—Ernest Karlsen
Assistant Examiner—Minh Tang
(74) Attorney, Agent, or Firm—Muramatsu & Associates

(57) ABSTRACT

A pin block structure formed with a pogo-pin block and a pogo-cap for mounting pogo-pins wherein the contact pins can be easily replaced or changed the positions in the pin block structure. The pogo-pin block includes a plurality of pogo-holes provided through the body of the pogo-pin block for inserting the pogo-pins therethrough, and connecting holes provided between each of the pogo-holes for connecting the spaces of the pogo-holes therethrough. The connecting holes are formed such that the pogo-pins and cables of the pogo-pins can freely pass from one pogo-hole to another pogo-hole through the connecting hole. The pogo-cap is attached to the pogo-pin block after mounting the pogo-pins on the pogo-pin block.

10 Claims, 8 Drawing Sheets

PIN BLOCK STRUCTURE FOR MOUNTING CONTACT PINS

FIELD OF THE INVENTION

This invention relates to a pin block structure for mounting a large number of contact pins to be used for testing semiconductor devices, and more particularly, to a pin block structure for mounting a large number of contact pins, such as pogo-pins, connected to wires or cables wherein the contact pins can be easily replaced with other pins or changed the positions in the pin block.

BACKGROUND OF THE INVENTION

When testing semiconductor devices, such as packaged integrated circuit (IC or LSI), semiconductor wafers, and the like, a semiconductor test system is usually connected to an automatic handler to automatically test the semiconductor devices. Such a semiconductor test system is sometimes called an LSI tester or an IC tester. Typically, an automatic handler includes a test handler for automatically supplying packaged ICs or LSIs to a test socket of the test system and a wafer prober for automatically positioning a semiconductor wafer relative to a probe card.

Although the present invention is not limited to the application of testing semiconductor wafers and die, but is inclusive of testing and burn-in of packaged semiconductor devices, modules, printed circuit boards and the like. The pin block structure of the present invention can also be used in more general applications including any contact fixtures, multi-pin sockets, and other electrical connectors. However, for the convenience of explanation, the present invention is described mainly with reference to the semiconductor wafer testing.

FIG. 1 shows an example of such a combination of a semiconductor test system and a wafer prober (substrate handler). The semiconductor test system has a test head 100 which is ordinarily in a separate housing and electrically connected to the test system with a bundle of cables 110. The test head 100 and the substrate handler 400 are mechanically as well as electrically connected with each other. The semiconductor wafers to be tested are automatically provided to a test position of the test head 100 by the substrate handler 400.

On the test head, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly.

FIG. 2 shows the connection between the test system and the substrate handler in more detail. The test head 100 and the substrate handler 400 are connected through an interface component 140 consisting of a performance board 120, signal cables 124 such as coaxial cables, a pin block structure including a pogo-pin block 130 and contact pins (pogo-pins) 141. The test head 100 includes a large number of printed circuit boards 150 which correspond to the number of test channels (pins) of the semiconductor test system. Each of the printed circuit boards 150 has a connector 160 to receive a corresponding contact terminal 121 of the performance board 120.

The pogo-pin block 130 is mounted on an upper surface of a frame (not shown) of the substrate handler 400. A large number of pogo-pins 141 are mounted on the pogo-pin block 130 where each of the pogo-pins 141 is connected to the performance board through the cable 124. As is well known in the art, a pogo-pin is a compressive contact pin having a spring therein. The pogo-pin block 130 is to accurately hold the pogo-pins 141 relative to the substrate handler 400.

In the substrate handler 400, a semiconductor device, such as a semiconductor wafer 300 to be tested, is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit of the semiconductor wafer 300 under test.

Contact pads (electrodes) on the upper surface of the probe card 170 are electrically connected to the pogo-pins 141 when the pogo-pin block 130 is pressed against the probe card 170. Because each pogo-pin 141 is configured to be elastic in the longitudinal direction by the spring therein, it is able to overcome the planarization problem (unevenness of the surface flatness) involved in the probe card, wafer prober frames, or the like. The pogo-pins 141 are also connected to the contact terminals 121 of the performance board 120 through the coaxial cables 124 wherein each contact terminal 121 of the performance board 120 is connected to the printed circuit board 150 of the test head 100. Further, the printed circuit boards 150 are connected to the semiconductor test system through the cable 110 having several hundreds of inner cables.

Under this arrangement, the probe contactors 190 contact with the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 functions correctly.

The forgoing is the basic configuration of the connection between the test head of the semiconductor test system and the substrate handler. The configurations of the pin block structure including the pogo-pin block 130, the pogo-pins 141 fitted in the pogo-pin block, and the probe card 170 for contacting with the pogo-pins are explained in more detail below.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 thereon moves upward in FIG. 2, the tips of the cantilevers 190 contact with the pads or bumps (contact targets) on the wafer 300. The ends of the cantilevers 190 are connected to transmission lines (not shown) formed in the probe card 170. The transmission lines are connected to a plurality of electrodes 197 (on the upper surface of the probe card 170) which further contact with the pogo-pins 141 of FIG. 2.

FIG. 4 is a cross sectional view of the pin block structure formed of the pogo-pin block 130 having a plurality of pogo-pins therein as shown in FIG. 2. The pogo-pin block 130 comprises a plurality of pogo-holes 131, wherein pogo-pins 141 are inserted to be captivated therein. A step like shape is provided to each pogo-hole 131 and pogo-pin 141 so that the inserted pogo-pin 141 is blocked at the predetermined depth in the pogo-hole 131. The pin block structure further includes a pogo-cap 132 for locking the pogo-pins 141 in the pogo-holes 131. Thus, the pogo-pins 141 are aligned in the same height on the pogo-pin block 130 without falling down from the pogo-holes 131.

As noted above, the tips of the pogo-pins 141 contact with the contact receptacles (contact pads) 197 of the probe card 170 when the pogo-pin block 130 is attached to the substrate handler 400. The other ends of the pogo-pins 141 are connected with the cables 124 such as coaxial cables which are further connected to the contact terminals 121 of the performance board 120.

In an actual application of the semiconductor device testing, a large number of such pogo-pins, several hundreds for example, must be mounted on the pogo-pin block with a small pitch and high positional accuracy. The pogo-pins 141 captivated by the pogo-holes 131 of the pogo-pin block 130 are arrayed to be accurately provided at predetermined contact positions relative to the contact pads 197 of the probe card 170.

In the pin block structure described in the foregoing, there arises a situation where such pogo-pins have to be replaced with other pogo-pins or changed the positions in the pogo-pin block. For example, when a semiconductor wafer having a different array of contact targets needs to be tested, the probe card 170 must be replaced with another new one having corresponding arrays of probe contactors 190. The array of the contact receptacles of the new probe card having the corresponding probe contactors is sometimes different from that of the old one in the allocation of the signal attribution. In such a case, the array of the pogo-pins fitted in the pogo-pin block 130 must be reconfigured in accordance with the new array of the contact receptacles of the new probe card.

Another example which requires the replacement or change of pogo-pin arises in the case where there is an error in the wiring of the coaxial cables connecting the contact terminals of the performance board 120 and the pogo-pins 141. Thus, the corresponding pogo-pins 141 in the pogo-holes 131 of the pogo-block 130 must be removed and fitted in the other pogo-hole to correct the wiring error. Moreover, since the pogo-pins 141 are mechanical component and may become defective or broken, which requires the replacement.

Under the circumstances, in order to reconfigure the array of the pogo-pins 141 mounted in the pogo-pin block 130, the coaxial cables 124 must be unsoldered and connected to the other position of the performance board 120. However, because unsoldering the cables and soldering the cables again in a very small space requires difficult manual works, which may adversely affect the reliability of the overall semiconductor test system. In addition, the assembly of this pogo-pins 141 and the coaxial cables 124 connected to the pogo-pins 141 must be extracted from the pogo-block 130, which may damage the pogo-pins 141.

Thus, in the conventional technology, because the time consuming and unreliable process is necessary for changing the pogo-pins 141, the replacement or position change of the pogo-pins 141 in the pogo-pin block has been a troublesome and difficult problem to be solved.

SUMMARY OF THE INVENTION

Therefore, it is an object of the present invention to solve the above problem by providing a pin block structure which is capable of easily replacing the pogo-pins or reconfiguring the array of pogo-pins.

It is another object of the present invention to provide a pin block structure which allows one to replace or change position of the pogo-pins connected with signal cables without disconnecting the signal cables.

It is a further object of the present invention to provide a pin block structure which is capable of assembling and disassembling the pogo-pins connected with signal cables without disconnecting the signal cables in a short time without affecting the reliability.

The above object of the present invention is achieved by providing a pin block structure for mounting pogo-pins which includes a pogo-pin block having a plurality of pogo-holes for inserting the pogo-pins therein, a connecting hole provided in the pogo-pin block relative to a predetermined number of pogo-holes in such a way that the pogo-pins can share a common space of the connecting hole, and a pogo-cap for locking the pogo-pins in the predetermined pogo-holes. The pogo-holes of the pogo-pin block are formed such that the inserted pogo-pins are fitted therein to be accurately positioned relative to the semiconductor test system. The connecting hole is formed such that the pogo-pins and cables connected to the pogo-pins can freely pass through the inner space created by the pogo-holes and the connecting holes.

According to the pin block structure of the present invention, each of the pogo-pins connected with the cable can be removed from the pogo-holes without disconnecting the cables and fitted in the other pogo-hole through the spaces created between the pogo-holes and the connecting holes. Thereafter, the pogo-pins thus replaced or rearranged in the pogo-holes are locked by attaching the pogo-cap to the pogo-pin block. Thus, the pogo-pins can be easily changed to the other pogo-holes when correcting the wiring error, reconfiguring the array of pogo-pins or the like. The pin block structure of the present invention is capable of assembling and disassembling the pogo-pins connected with signal cables without disconnecting the signal cables in a short time without affecting the reliability.

DETAILED DESCRIPTION OF THE EMBODIMENTS

Figure 5:
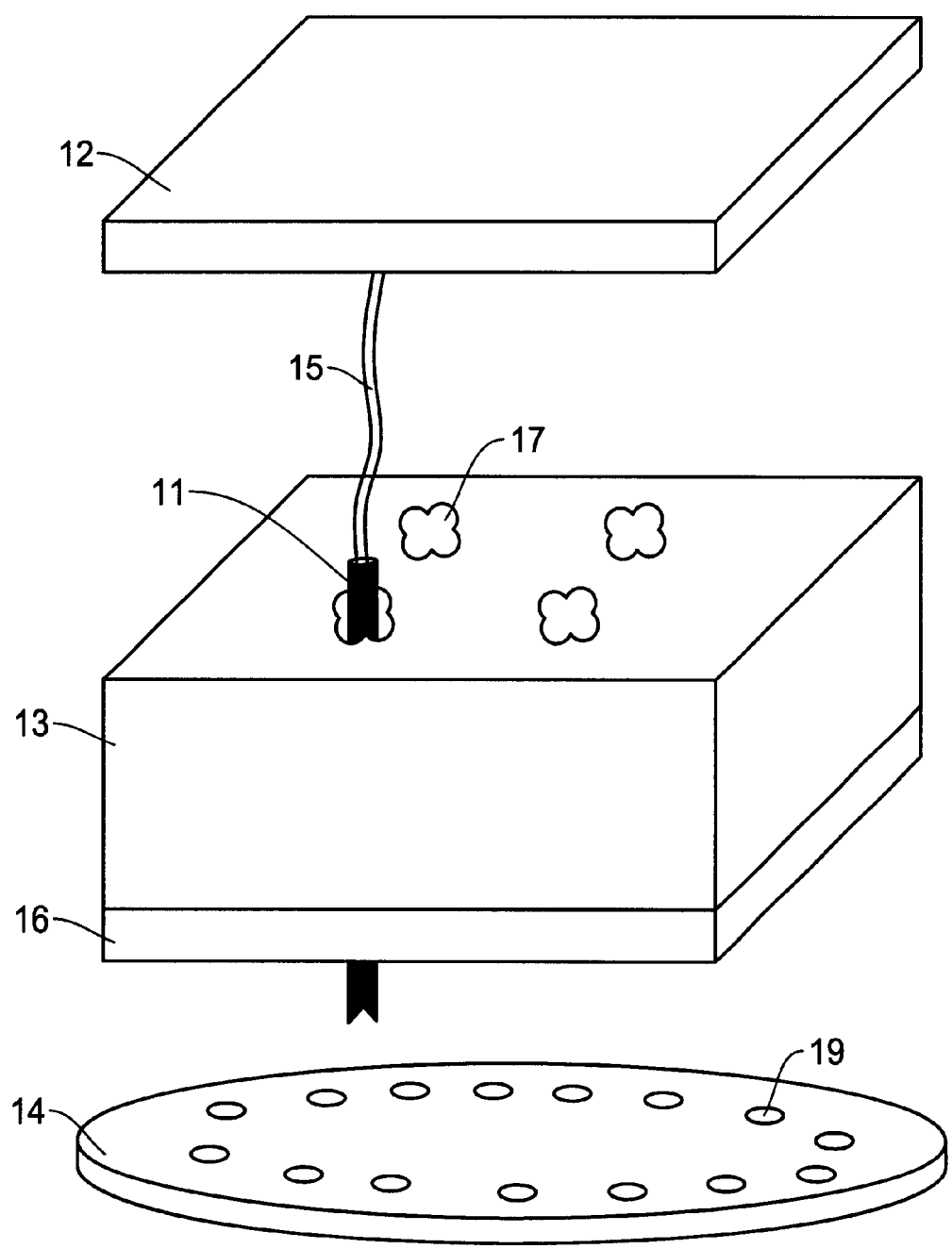
FIG. 5 is a perspective showing a pin block structure in the embodiment of the present invention having pogo-pins inserted in the pogo-holes thereof.

Referring now to the drawings, the embodiment of the present invention is explained in detail. FIG. 5 is a perspective view of the pin block structure of the present invention which consists of a pogo-pin block 13, a pogo-pin 11 and a pogo-cap 16. In an actual implementation, a large number of pogo-pins are incorporated in the pogo-pin block 13. FIG. 5 also shows a performance board 12 which is connected to a test head (not shown) of the semiconductor test system and a probe card 14 having contact pads 19. Although not shown, the probe card 14 has contactors, such as contact needles, at the bottom thereof to establish an electric contact with the semiconductor device to be tested. The pin block structure is provided between the performance board 12 and the probe card 14.

Figure 4:
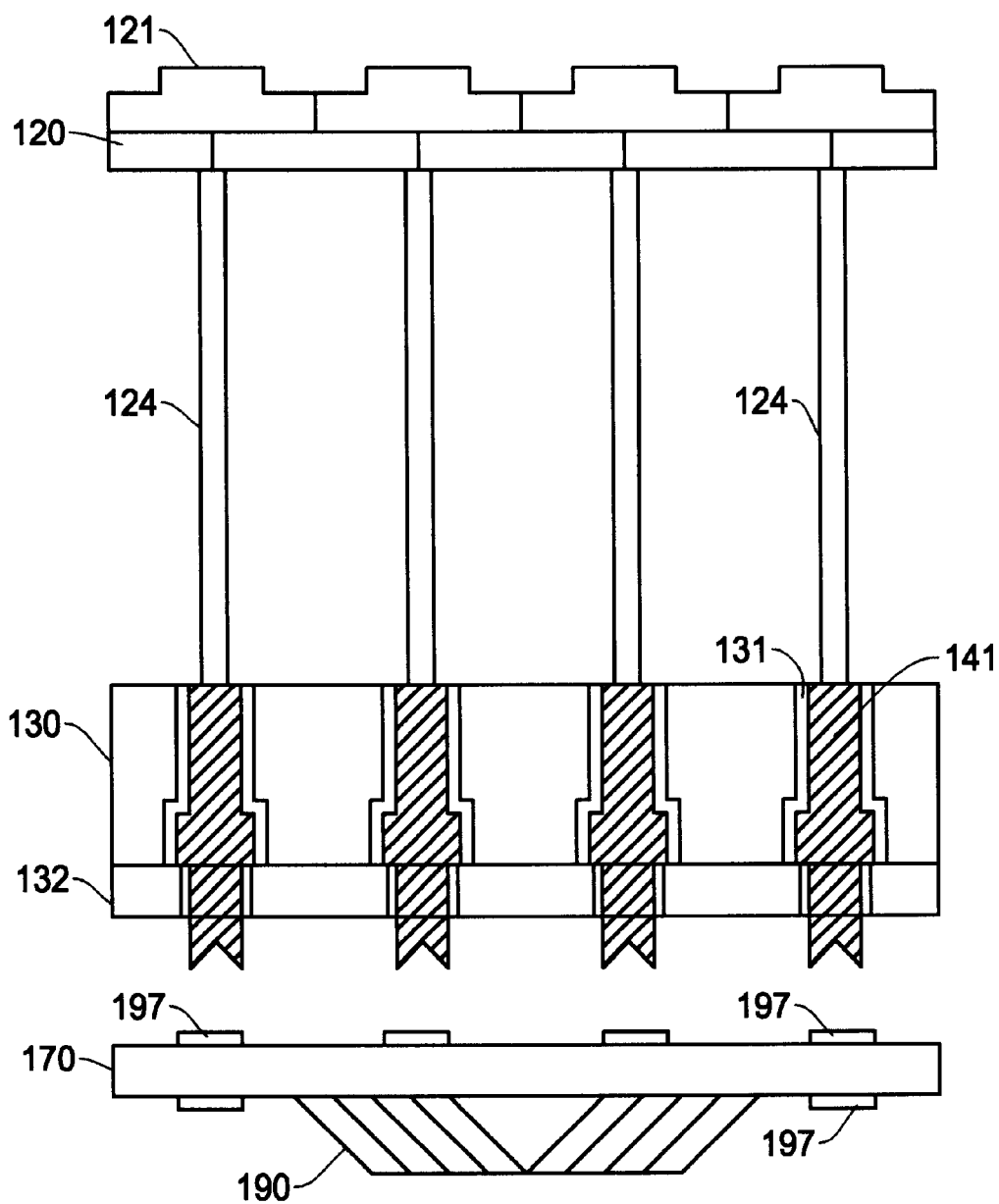
FIG. 4 is a cross sectional view of the configuration of the conventional pogo-pin block having pogo-pins being inserted into the pogo-holes thereof.

In the pogo-pin block 13, the pogo-pins 11 are inserted into pogo-holes 17 in the vertical direction to contact with the contact pads 19 of the probe card 14. In the pogo-hole 17, there is provided a step like shape (stopper) such as shown in FIG. 4 so that the pogo-pin 11 is stopped at the predetermined depth of the pogo-hole when the projection of the pogo-pin 11 engages with the stopper. In FIG. 5, cables 15 are connected to pogo-pins 11. The other ends of the cables 15 are connected to, for example, the performance board 12. The cable 15 is typically a coaxial cable with a predetermined characteristic impedance for transmitting a signal therethrough.

Figure 1:
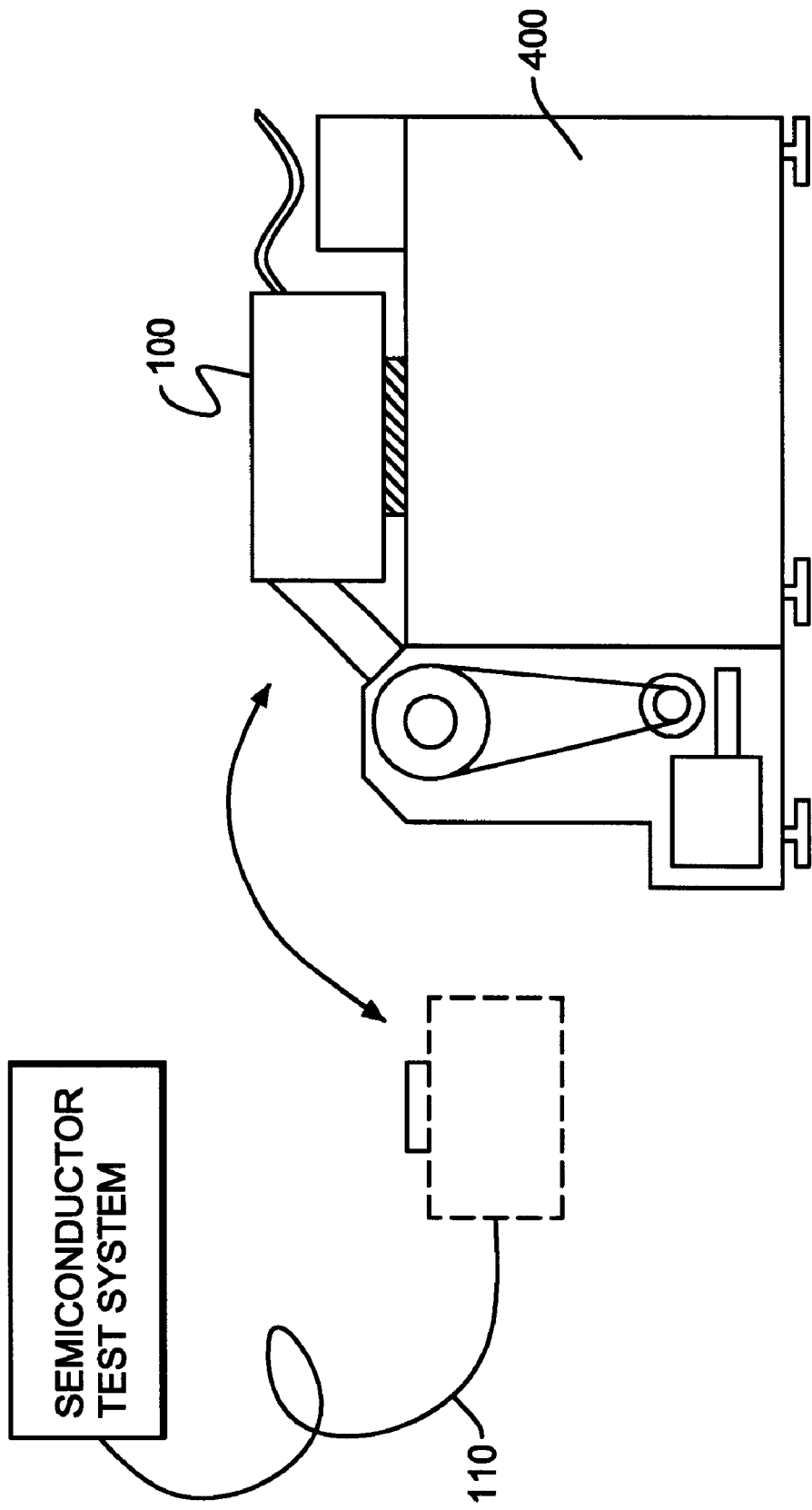
FIG. 1 is a schematic diagram showing a structural relationship between a substrate handler and a semiconductor test system having a test head.
Figure 2:
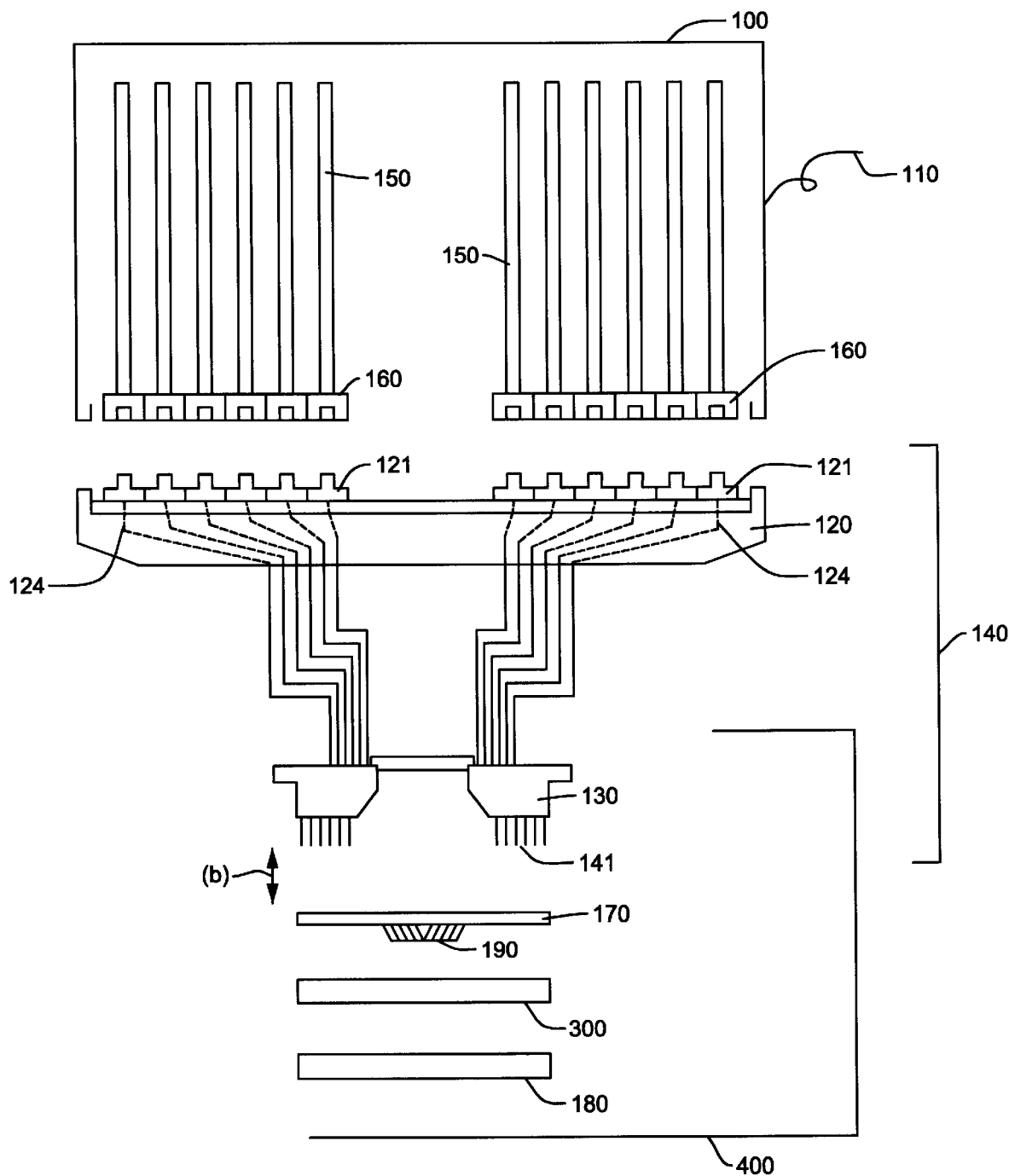
FIG. 2 is a diagram showing an example of a detailed structure for connecting the test head of the semiconductor test system to the substrate handler through an interface component.
Figure 3:
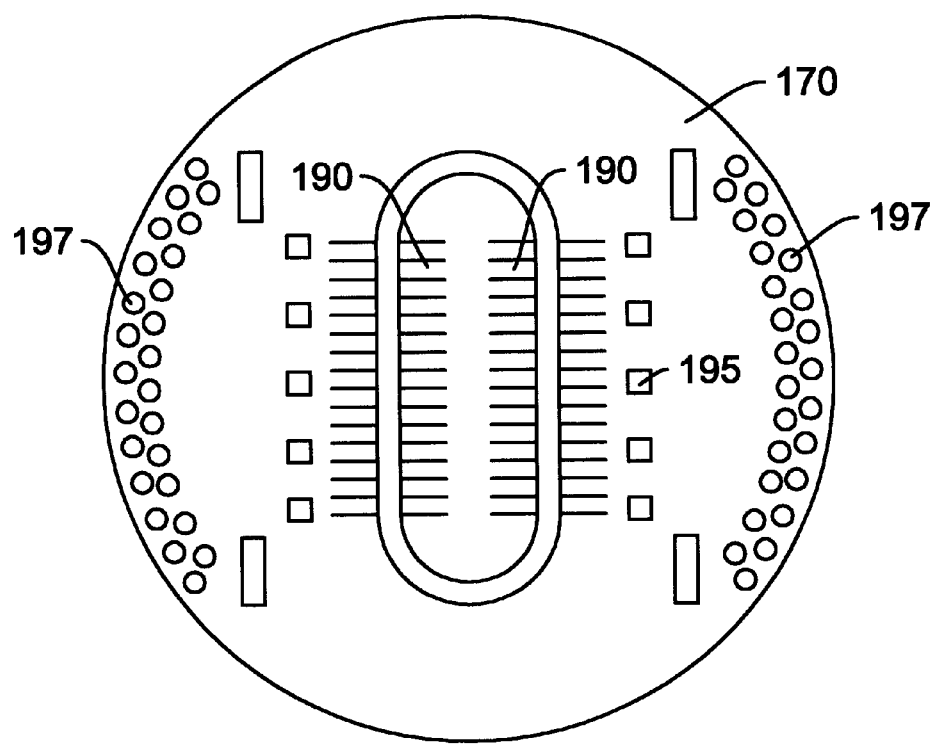
FIG. 3 is a bottom view showing an example of the probe card having an epoxy ring for mounting a plurality of probe contactors in the conventional technology.

When the performance board 12, the pin block structure, and the probe card 14 are appropriately mounted on the test head and substrate handler of FIG. 2, the electrical connection is established where tips of the pogo pins 11 contact with the contact pads 19 on the probe card 14. Thus, when the chuck of FIG. 2 mounting the semiconductor device moves upward, electrical connection is established between the test head of the semiconductor test system and the semiconductor device to be tested.

Figure 6:
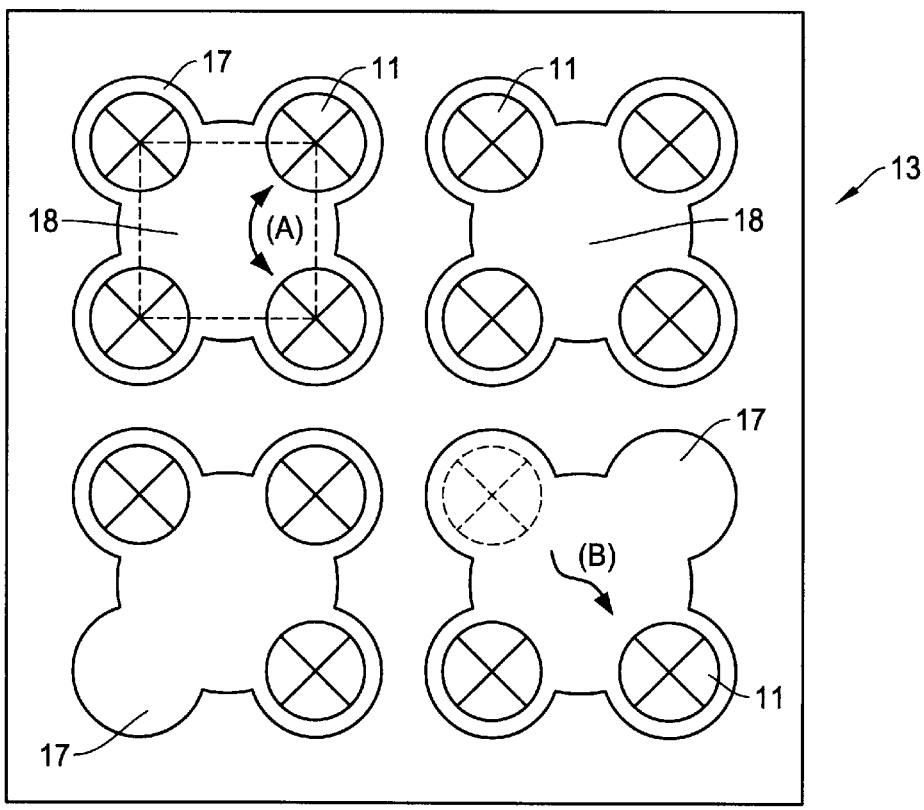
FIG. 6 is a bottom view showing the pogo-pin block for replacing and/or changing positions of the pogo-pins in the embodiment of the present invention.
Figure 7:
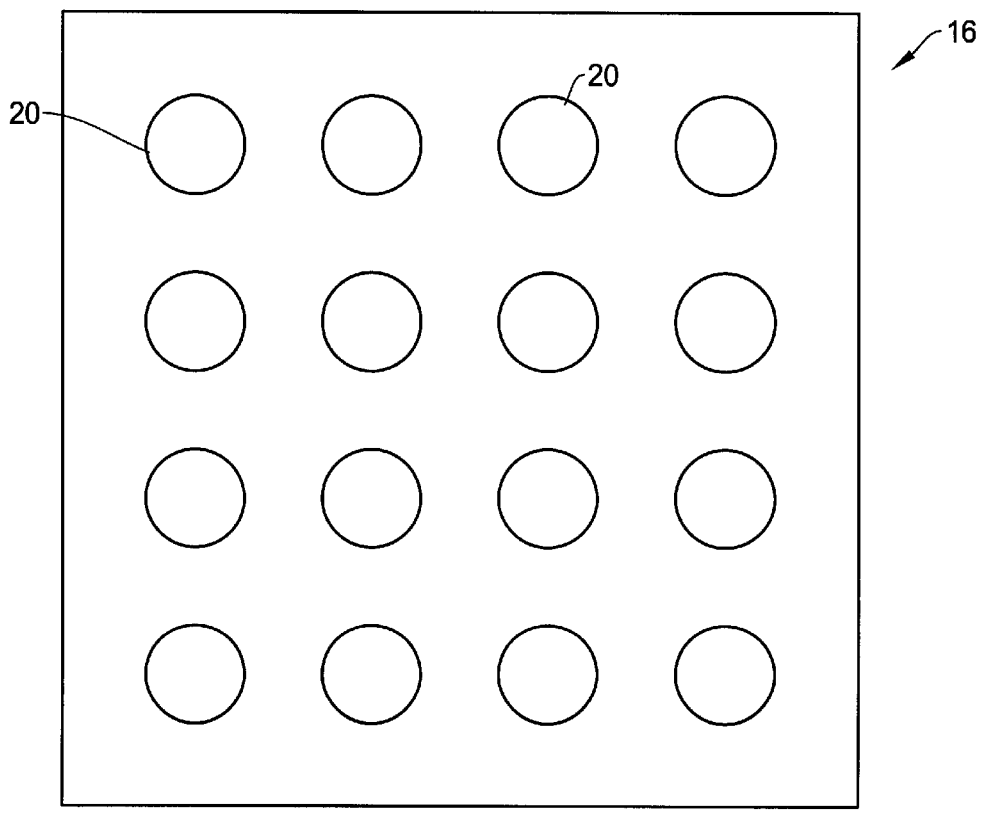
FIG. 7 is a bottom view showing the pogo-cap to be used in combination with the pogo-pin block of FIG. 6 in the embodiment of the present invention.

The bottom view of the pogo-pin block 13 is shown in FIG. 6 for explaining the effect of the present invention in replacing and/or changing positions of the pogo-pins 11. The bottom view of FIG. 7 is to explain the relationship between the pogo-holes and pogo-cap for fixing the pogo-pins 11 in the pogo-holes of the pogo-pin block 13.

As shown in FIG. 6, a plurality of pogo-holes 17 are commonly provided with a common hole or a connecting hole 18. In this example, four pogo-pins 17 share the same connecting hole 18 which is provided at the center of the four pogo-pins 17. It should be noted that a combination of only one pogo-hole 17 and a connecting hole 18 can achieve the purpose of the present invention, although sharing a common connecting hole 18 by two or more pogo-holes 17 is preferable. The connecting hole 18 has a diameter larger than the diameter of each pogo hole 17 so as to allow the pogo-pin 11 to pass therethrough. Namely, the diameter of the inner space of the connecting hole 18 when the pogo-pins 11 are mounted in the pogo-holes 17 is designed to be larger the largest diameter (projection) of the pogo-pin 11.

In the example of FIG. 6, four pogo-holes 17 are provided at the four corners of an imaginary square which is shown by a broken line such that the center of each of the pogo-holes 17 are positioned at the corner of the square. A relatively large connecting hole 18 is provided at the center such that each of the pogo-holes 17 is continuous to other pogo-holes 17 through the connecting hole 18.

When the pogo-pins 11 are to be fixed to the pogo-pin block 13, the pogo-cap 16 is attached to the pogo-pin block by a fastening means such as a screw (not shown). The pogo-cap 16 has a plurality of cap-holes 20 as shown in FIG. 7 which are accurately positioned to meet the pogo-holes 17 in the pogo-pin block 13. The diameter of the cap-hole 20 is designed to be slightly larger than the pogo-pin 11 so as to lock the pogo-pin 11 in the pogo-hole 17. Thus the pogo-pins 11 are fixed to the pin block structure when the pogo-cap 16 is attached to the pogo-pin block 13.

When the pogo-pins 11 are mounted on the pin block structure, the top ends of the pogo-pins 11 penetrate the pogo-holes 17 and the corresponding cap-holes 20 to contact with the contact pads 19 of the probe card 14. The position and pitch of the pogo-holes 17 and cap-holes 20 are accurately designed so that the pogo-pins 11 engage accurately with the corresponding contact pads 19 of the probe card 14. Under this condition, test signals from the semiconductor test system are supplied to the semiconductor wafer under test through the pogo-pins 11 and cables 15 and the response signals through the pogo-pins 11 and cables 15 are evaluated by the semiconductor test system.

As stated in the foregoing with reference to the conventional technology, there arises a situation where the pogo-pins 11 have to be replaced with other pogo-pins or moved to other positions on the pogo-pin block 13. In such an event, in the present invention, the pogo-pins 11 can be easily removed from the pogo-pin block 13 and moved to other positions in the pogo-pin block 13. Such a replacement or position change is carried out in the following manner.

First, the pogo-cap 16 is removed from the pogo-pin block 13. Next, the intended pogo-pin 11 is withdrawn from the pogo-hole 17 of the pogo-pin block 13. Since the diameter of the pogo-hole 17 is set larger than the thickness of the connecting cable, the pogo-pin 11 connected with the cable 15 is easily disconnected from the pogo-hole 17.

Under this condition, the pogo-pins 11 disconnected from the pogo-hole 17 are shifted to the connecting hole 18 which is common to other pogo-hole. In the case where two pogo-pins 11 sharing the same connecting hole 18 have to be replace with one another, they are exchanged the positions and inserted in the intended pogo-holes 17 as indicated by an arrow (A) of FIG. 6. In the case where the pogo-pin 11 is to change the position to one of the pogo-holes sharing the same connecting hole 18, it may be shifted to new position and inserted in the intended pogo-hole 17 as indicated by an arrow (B).

In the case where the pogo-pin 11 is to move to the different group of pogo-holes 18, the pogo-pin 11 is removed from the pogo-pin block 13 and inserted in the connecting hole 18 of the other group of pogo-holes 17. Then, the pogo-pin 11 is shifted to the position of the intended pogo-hole 17 and inserted therein.

After the pogo-pins 11 are inserted into the new pogo-holes 17, the pogo-cap 16 having corresponding cap-holes 20 as shown in FIG. 7 is attached to the pogo-pin block 13 so as to firmly fix the pogo-pins 11 in the new position in the pogo-pin block 13. As noted above, the diameter of the cap-holes 20 is slightly larger than the diameter of the pogo-pins 11, the pogo-pins 11 are fixed to the pogo-pin block 13 in the intended pogo-holes 17.

Figure 8B:
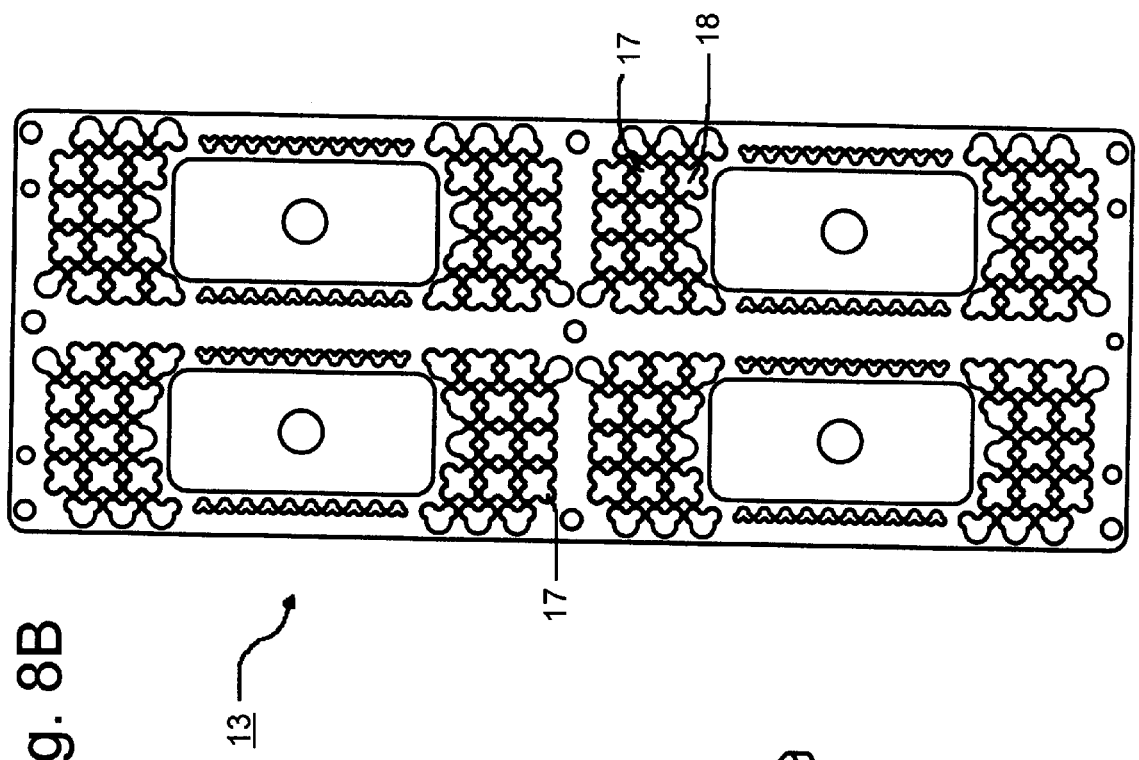
FIG. 8B is a top view of the pogo-pin block of FIG. 8A.
Figure 8A:
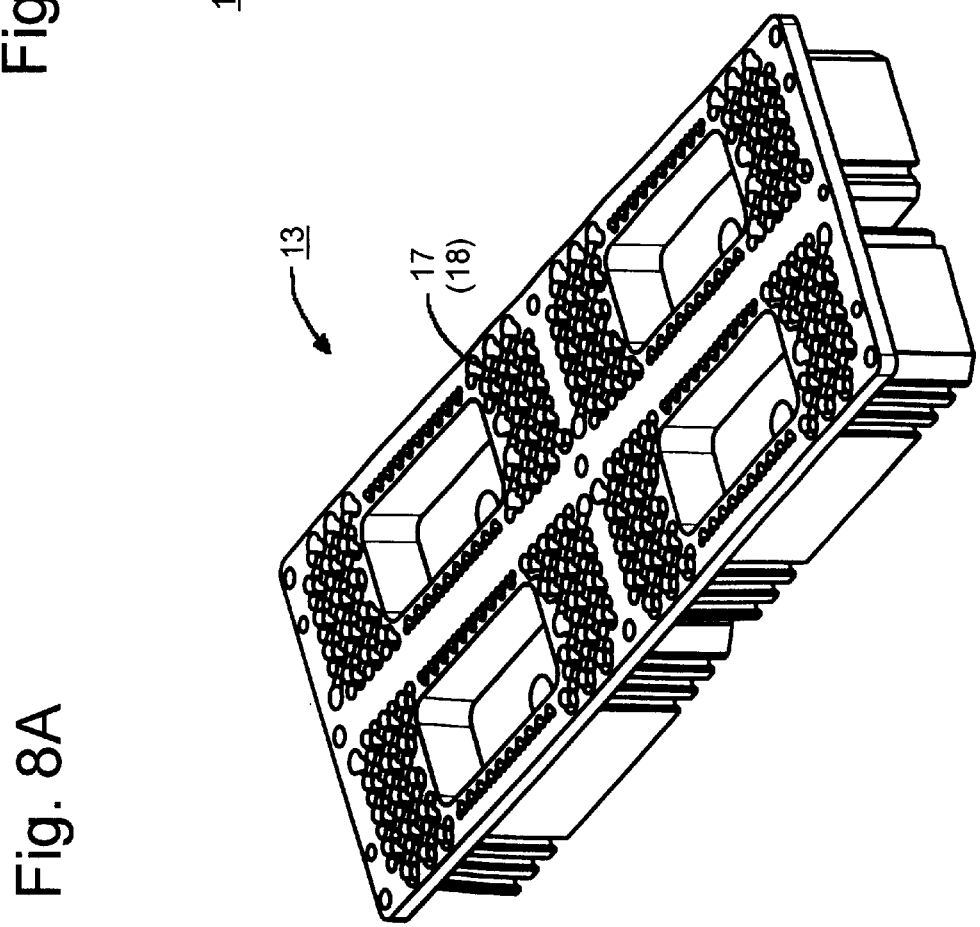
FIG. 8A is a perspective view showing an example of actual implementation of the pogo-pin block of the present invention without having pogo-pins therein.
Figure 9B:
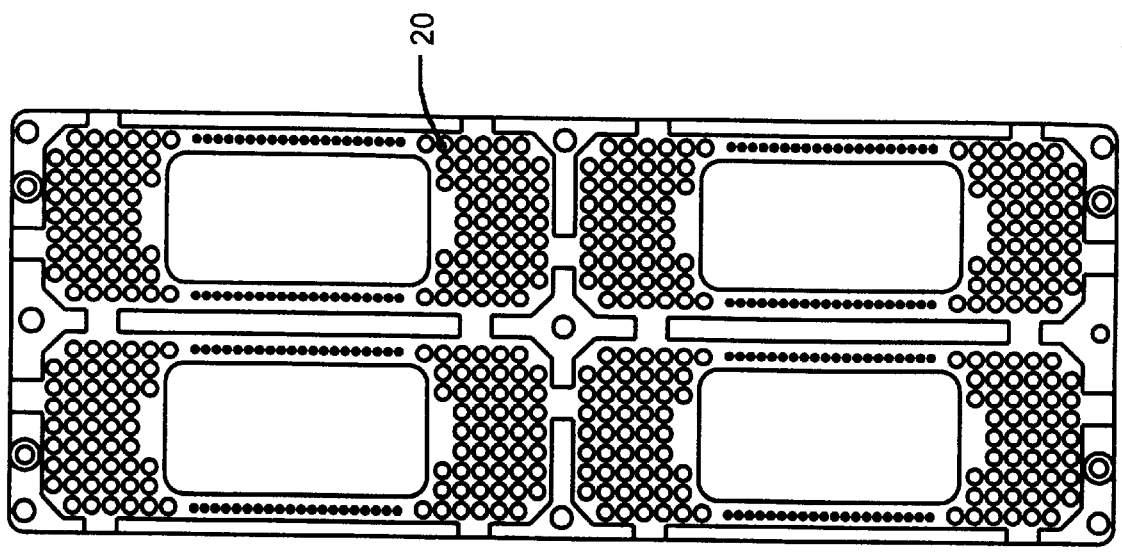
FIG. 9B is a top view of the pogo-cap of FIG. 9A.
Figure 9A:
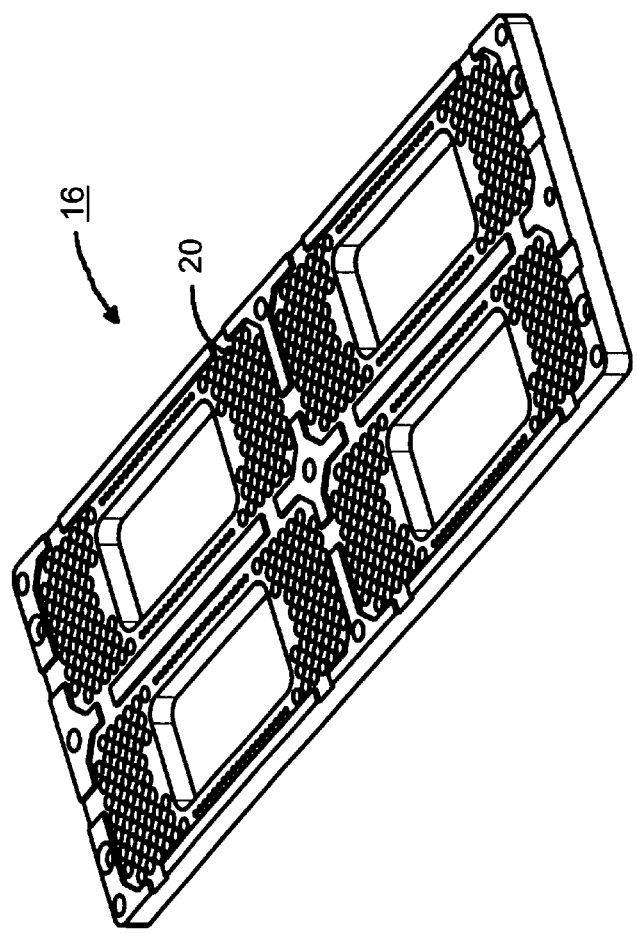
FIG. 9A is a perspective view showing an example of actual implementation of the pogo-cap to be used in combination with the pogo-pin block of FIG. 8.

FIG. 8A is a perspective view showing an example of actual implementation of the pogo-pin block of the present invention without having pogo-pins therein, and FIG. 8B is a top view of the pogo-pin block 13 of FIG. 8A. Similarly, FIG. 9A is a perspective view showing an example of actual implementation of the pogo-cap 16 to be used in combination with the pogo-pin block of FIG. 8, and FIG. 9B is a top view of the pogo-cap 16 of FIG. 9A. When the pogo-cap 16 is attached to the pogo-pin block 13, the pogo-pins inserted in the pogo-holes 17 are fixed to the accurate positions of the pogo-pin block 13.

In FIGS. 8A–8B and 9A–9B, a large number of pogo-holes 17 are provided on the pogo-pin block 13 wherein a group of two, three or four pogo-holes 17 shares a common connecting hole 18. It should be noted that the present invention can also be applicable to a block structure having only one pogo hole. In FIGS. 8A–8B and 9A–9B, array of the pogo-holes are configured to match the array of contact pads of the typical probe card which is generally used for contacting with the surface of a semiconductor wafer. The array of pogo-pins 11 inserted into the pogo-holes 17 may be easily reconfigured by the method as described above. Therefore, reconfiguration of the pogo-pin array in accordance with the array of new probe card or correcting the pogo array can be achieved without disconnecting the signal cables from the pogo-pin.

According to the pin block structure of the present invention, each of the pogo-pins connected with the cable can be removed from the pogo-holes without disconnecting the cables and fitted in the other pogo-hole through the spaces created between the pogo-holes and the connecting holes. Thereafter, the pogo-pins thus replaced or rearranged in the pogo-holes are locked by attaching the pogo-cap to the pogo-pin block. Thus, the pogo-pins can be easily changed to the other pogo-holes when correcting the wiring error, reconfiguring the array of pogo-pins or the like. The pin block structure of the present invention is capable of assembling and disassembling the pogo-pins connected with signal cables without disconnecting the signal cables in a short time without affecting the reliability.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A pin block structure for mounting a plurality of pogo-pins therein, comprising:

a pogo-pin block having the plurality of pogo-holes for inserting the pogo-pins therein, each of the pogo-pins being connected with a signal cable and inserted in corresponding one of the pogo-holes;

a connecting hole provided in the pogo-pin block at a center of a predetermined number of pogo-holes in such a way that the connecting hole and all of the predetermined number of pogo-holes are connected with one another; and a pogo-cap for locking the pogo-pins in the predetermined pogo-holes;

wherein the pogo-holes of the pogo-pin block are formed such that the inserted pogo-pins are fitted therein to be accurately positioned relative to a semiconductor test system, and the connecting hole has a diameter larger than a diameter of each of the pogo-holes so that the pogo-pin and the signal cable connected to the pogo-pin can freely pass through the connecting hole to move from one pogo-hole to another.

2. A pin block structure for mounting a plurality of pogo-pins as defined in claim 1, wherein the connecting hole is provided at a center of four pogo-holes such that each of the four pogo-holes is connected with other pogo-holes through the connecting hole, thereby enabling to move the pogo-pin from one of the four pogo-holes to another one of the four pogo-holes through the connecting hole without removing the pogo-pin from the pogo-pin block.

3. A pin block structure for mounting a plurality of pogo-pins as defined in claim 1, wherein the diameter of the connecting hole is larger than a maximum diameter of the pogo-pin or the signal cable connected to the pogo-pin.

4. A pin block structure for mounting a plurality of pogo-pins as defined in claim 1, wherein the connecting hole is provided at a center of two pogo-holes such that one pogo-hole is connected to another pogo-hole through the connecting hole, thereby enabling to move the pogo-pin from one pogo-hole to another pogo-hole through the connecting hole without removing the pogo-pin from the pogo-pin block.

5. A pin block structure for mounting a plurality of pogo-pins as defined in claim 1, wherein the connecting hole is provided at a center of three pogo-holes such that the three pogo-holes are connected with one another through the connecting hole, thereby enabling to move the pogo-pin from one of the three pogo-holes to the another one of the three pogo-holes through the connecting hole without removing the pogo-pin from the pogo-pin block.

6. A pin block structure for mounting a plurality of pogo-pins therein, comprising:

a pogo-pin block having a plurality of pogo-holes for inserting pogo-pins therein, each of the pogo-pins being inserted in corresponding one of the pogo-holes;

a connecting hole provided in the pogo-pin block at a center of a predetermined number of pogo-holes in such a way that the connecting hole and all of the predetermined number of pogo-holes are continuously connected with one another; and a pogo-cap having a plurality of holes corresponding to the plurality of pogo-holes on the pogo-pin block for locking the pogo-pins in the predetermined pogo-holes when the pogo-cap is attached to the pogo-pin block;

wherein the connecting hole has a diameter larger than a diameter of each of the pogo-holes so that the pogo-pin can freely shift a position from one pogo-hole to another pogo-hole through the connecting hole.

7. A pin block structure for mounting a plurality of pogo-pins as defined in claim 6, wherein the connecting hole is provided at a center of two pogo-holes such that one pogo-hole is connected to another pogo-hole through the connecting hole, thereby enabling to move the pogo-pin from one pogo-hole to another pogo-hole through the connecting hole without removing the pogo-pin from the pogo-pin block.

8. A pin block structure for mounting a plurality of pogo-pins as defined in claim 6, wherein the connecting hole is provided at a center of three pogo-holes such that the three pogo-holes are connected with one another through the connecting hole, thereby enabling to move the pogo-pin from one of the three pogo-holes to another one of the three pogo-holes through the connecting hole without removing the pogo-pin from the pogo-pin block.

9. A pin block structure for mounting a plurality of pogo-pins as defined in claim 6, wherein the connecting hole is provided at a center of four pogo-holes such that the four pogo-holes are connected with one another through the connecting hole, thereby enabling to move the pogo-pin from one of the four pogo-holes to another one of the four pogo-holes through the connecting hole without removing the pogo-pin from the pogo-pin block.

10. A pin block structure for mounting a plurality of pogo-pins as defined in claim 6, wherein the diameter of the connecting hole is larger than a maximum diameter of the pogo-pin or a signal cable connected to the pogo-pin.

* * * * *